United States Patent
Lee et al.

(10) Patent No.: US 8,174,057 B2
(45) Date of Patent: May 8, 2012

(54) CMOS IMAGE DEVICE WITH LOCAL IMPURITY REGION

(75) Inventors: Seok-ha Lee, Seoul (KR); Jae-seob Roh, Gyeonggi-do (KR); Jong-Wan Jung, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 307 days.

(21) Appl. No.: 12/395,757

(22) Filed: Mar. 2, 2009

(65) Prior Publication Data

US 2009/0166696 A1    Jul. 2, 2009

Related U.S. Application Data

(63) Continuation of application No. 11/373,935, filed on Mar. 13, 2006, now Pat. No. 7,514,733.

(30) Foreign Application Priority Data

Jun. 21, 2005 (KR) .................. 10-2005-0053555

(51) Int. Cl.
*H01L 31/062* (2012.01)
*H01L 31/113* (2006.01)

(52) U.S. Cl. ....................... 257/262; 257/293

(58) Field of Classification Search .......... 257/290–294, 257/431–448, E31.073, E31.127, E27.133
See application file for complete search history.

(56) References Cited

U.S. PATENT DOCUMENTS

| | | | |
|---|---|---|---|
| 5,977,576 A | 11/1999 | Hamasaki | |
| 6,713,796 B1 | 3/2004 | Fox | |
| 6,730,899 B1 | 5/2004 | Stevens et al. | |
| 7,015,522 B2 | 3/2006 | Miyagawa et al. | |

FOREIGN PATENT DOCUMENTS

| | | |
|---|---|---|
| JP | 03-201478 | 9/1991 |
| JP | 2000-286405 | 10/2000 |
| JP | 2003-188367 | 7/2003 |
| JP | 2004-221578 | 8/2004 |
| KR | 1020040008663 A | 1/2004 |
| KR | 1020040080708 A | 9/2004 |
| KR | 1020050036819 A | 4/2005 |

OTHER PUBLICATIONS

Korean Patent Office Notice of Office Action for Korean Application No. 10-2005-0053555; date of mailing Oct. 27, 2006.

*Primary Examiner* — Cuong Q Nguyen
(74) *Attorney, Agent, or Firm* — Myers Bigel Sibley & Sajovec, P.A.

(57) ABSTRACT

According to a CMOS image device and a method of manufacturing same, dark current is decreased by a local impurity region. The image device includes a semiconductor substrate, and a transfer gate formed on a predetermined portion of the semiconductor substrate and electrically insulated from the semiconductor substrate. A photodiode is formed in the semiconductor substrate on one side of the transfer gate, and a floating diffusion region is formed on the semiconductor substrate in the other side of the transfer gate. A local impurity region of a first conductivity type is formed to be partially overlapped the transfer gate between the photodiode and the floating diffusion region.

10 Claims, 7 Drawing Sheets

# CMOS IMAGE DEVICE WITH LOCAL IMPURITY REGION

REFERENCE TO PRIORITY APPLICATION

This application is a continuation of U.S. patent application Ser. No. 11/373,935, filed Mar. 13, 2006 (now U.S. Pat. No. 7,514,733), which claims the benefit of Korean Patent Application No. 10-2005-0053555, filed Jun. 21, 2005, the disclosures of which are hereby incorporated herein by reference.

FIELD OF THE INVENTION

The present invention relates to a Complementary Metal Oxide Semiconductor (CMOS) image device and a method of manufacturing the same, and more particularly to a CMOS image device with a local impurity region to decrease dark current, and a method of manufacturing the same.

BACKGROUND OF THE INVENTION

CMOS image devices are widely used as solid-state image sensors. A unit pixel of a CMOS image device includes MOS transistors that can be embodied in a relatively small area to thereby provide high resolution. Moreover, processing logic can be integrated with the unit pixels, which means the image circuit and the signal processing circuit can be integrated on one chip.

A unit pixel of the CMOS image device includes a photodiode for sensing images. In addition to the photodiode, each unit pixel includes a transfer transistor, a reset transistor and an amplifying transistor, to transfer the signal sensed by the photodiode to a signal processing circuit. Unfortunately, the CMOS image sensor with the foregoing structure may support parasitic dark currents due to structural problems. The dark current may be caused by dangling bonds occurring on an interfacial surface between layers of different materials (e.g., an interfacial surface of a silicon substrate and a silicon oxide layer). The dangling bonds extend between a valence band and a conduction band in an energy band, and may trap electrons regardless of the supply of light causing electron generation in the conduction band. The trapped electrons may be accumulated in the photodiode and cause the generation of a white spot on a picture as an image is acquired. This white spot may take the form of a ghost image.

In order to reduce an influence of the dangling bond that incites the dark current as described above, a p-type impurity region may be formed in the interfacial surface between layers of different materials (i.e., at the surface of the substrate, where the CMOS image sensor is formed). Such a CMOS image device is disclosed in U.S. Pat. No. 6,730,899.

FIG. 1 partially illustrates a CMOS image device having a p-type image region. Referring to FIG. 1, the CMOS image device 10 includes a photodiode 20 for converting light to charge, formed within a semiconductor substrate 15, and a transfer transistor 30 transferring the charge sensed by the photodiode 20 to a floating diffusion region 40. Also, a reset transistor 50 resets the floating diffusion region 40, and an amplifier 60 buffers a voltage of the floating diffusion region 40. The photodiode 20 includes an n-type photodiode region 20a and a p-type photodiode region 20b disposed thereon. The floating diffusion region 40 is composed of a high-density n-type impurity region. The transfer transistor 30 includes a transfer gate 35 disposed between the photodiode 20 and the floating diffusion region 40. In this case, the transfer gate 35 is insulated from the semiconductor substrate 15 by a gate oxide layer 32. The transfer gate 35 transfers the charge generated from the photodiode 20 to the floating diffusion region 40. A p-type impurity region 70 is formed opposite the transfer gate 35 (i.e., on the entire surface of the substrate between the photodiode 20 and the floating diffusion region 40), to get rid of an influence of the dark source (i.e., dangling bonds). The impurities in the p-type impurity region 70 inhibit the dark source current.

In the conventional CMOS image device, the n-type photodiode region 20a of the photodiode 20 may extend underneath the transfer gate 35 to inhibit an image lag. However, the extension of the n-type photodiode region 20a may induce a potential barrier (refer to the lower portion of FIG. 1) underneath the transfer gate 35, which extends toward the floating diffusion region 40. The slope of the potential barrier towards the photodiode 20 may become abrupt. Due to this fact, electrons which may remain on the interfacial surface of the substrate 15 and the gate oxide layer 32 may be forced back towards the photodiode 20, thereby causing the dark current.

SUMMARY OF THE INVENTION

Embodiments of the present invention include CMOS image sensors having unit cells therein that are configured to inhibit dark current parasitics that impair image generation. According to these embodiments, the channel regions of the transfer transistors within each image sensor unit cell are non-uniformly doped in order to facilitate charge carrier removal of residual electrons. In these embodiments, a CMOS image sensor unit cell is provided that includes a semiconductor substrate (e.g., P-type substrate) having a photodiode therein. This photodiode, which extends adjacent a surface of the semiconductor substrate, includes a semiconductor anode region of first conductivity type and a semiconductor cathode region of second conductivity type therein. A floating diffusion region of second conductivity type is also provided in the semiconductor substrate, at a spaced location relative to the photodiode. A MOS transfer transistor is provided with a gate electrode on a first portion of the surface. This MOS transfer transistor includes a first conductivity type channel region, which extends to the first portion of the surface. The MOS transfer transistor is configured so that the floating diffusion region represents a source of the MOS transfer transistor and the channel region of the MOS transistor extends between the photodiode and the floating diffusion region. To inhibit dark current parasitics, a first impurity region of first conductivity type is provided. This first impurity region extends in a drain-side portion of the channel region. The first impurity region is sufficiently doped so that a drain-side of the channel region adjacent the photodiode is more highly doped with first conductivity type dopants relative to a source-side of the channel region extending adjacent the source of the MOS transfer transistor. According to aspects of these embodiments, the first inhibiting impurity region forms a non-rectifying junction with the semiconductor anode region of first conductivity type and a P-N rectifying junction with the semiconductor cathode region of second conductivity type. The first impurity region is spaced from said floating diffusion region.

According to additional embodiments of the invention, a second impurity region of second conductivity type is provided in addition to the first impurity region. The second impurity region extends underneath and forms a P-N rectifying junction with the first impurity region. In some of these embodiments, the second impurity region may extend entirely underneath the gate electrode and form a non-rectifying junction with the semiconductor cathode region and a non-rectifying junction with said floating diffusion region.

DETAILED DESCRIPTION OF THE INVENTION

Figure 1:
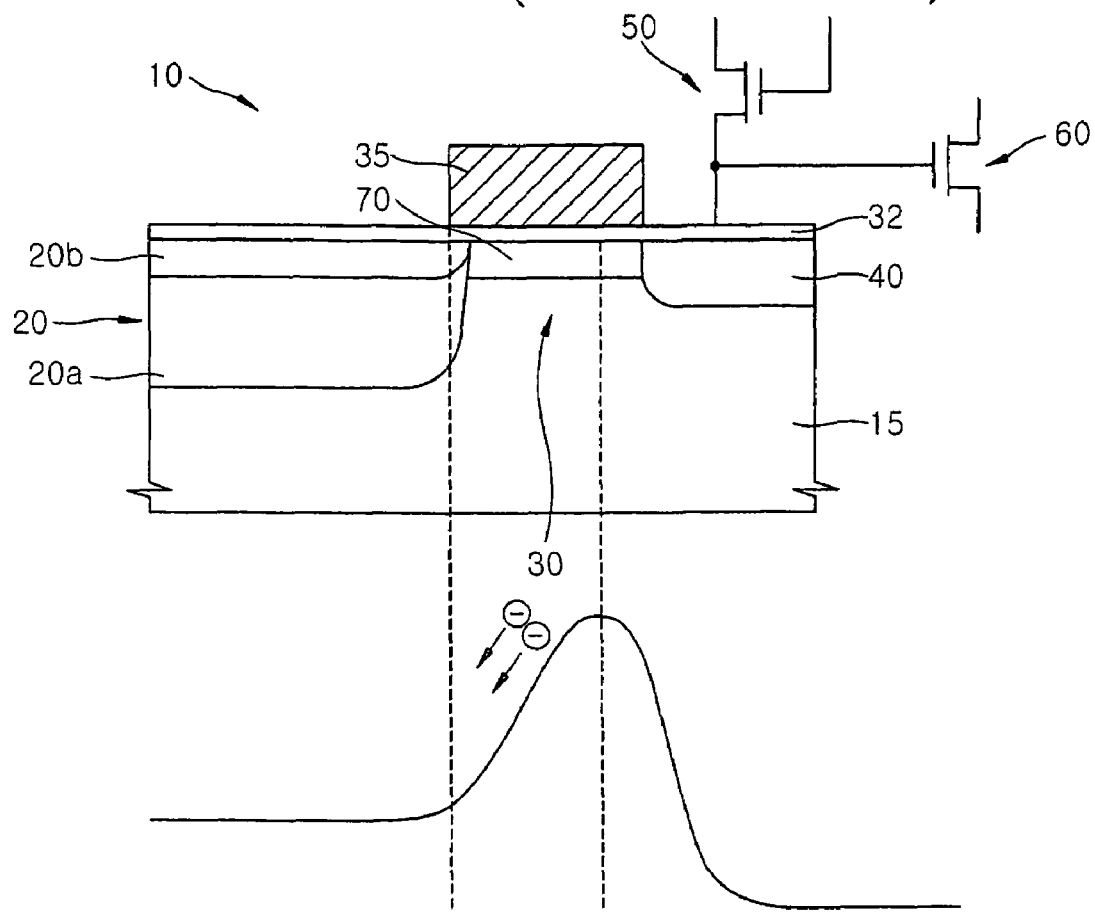
FIG. 1 partially illustrates a CMOS image device having a p-type impurity region.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

Figure 2:
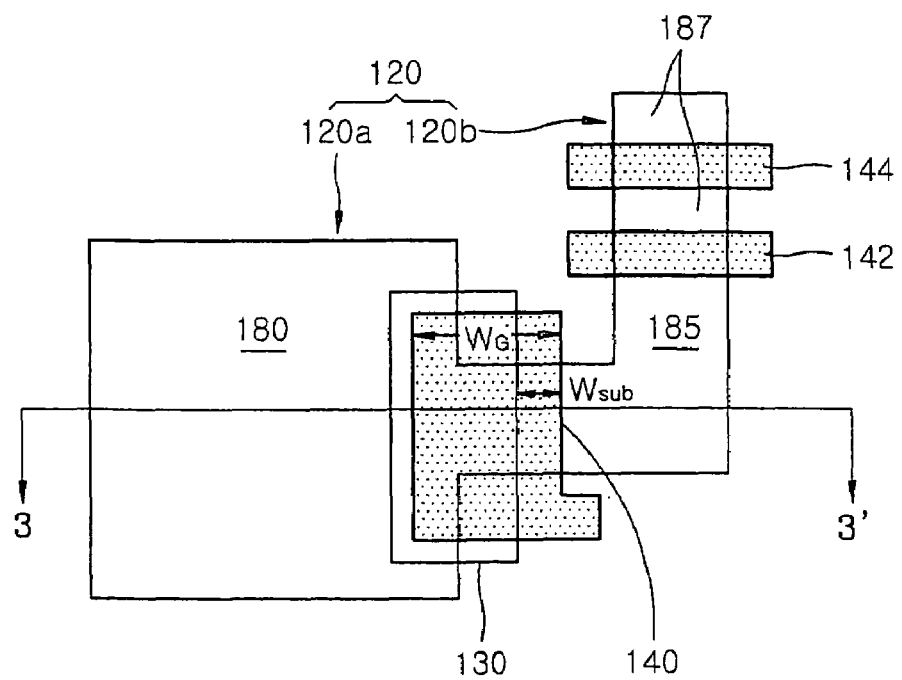
FIG. 2 is a plan view illustrating a unit pixel of a CMOS image device including a local impurity region according to the present invention.

In CMOS image devices according to an embodiment of the present invention, a p-type impurity region is partially overlapped with a transfer gate. By doing so, a peak of a potential barrier of the transfer gate is disposed adjacent to a photodiode, so that electrons existing in a channel region of the transfer transistor are discharged (i.e., swept away) towards a floating diffusion region. The CMOS image device also has an n-type impurity region on a lower surface of the p-type impurity region to wholly or partially overlap with the p-type impurity region. Accordingly, a potential barrier of the transfer gate is lowered so that electrons existing in the channel region of the transfer transistor are more easily discharged toward the floating diffusion region. The CMOS image device with the above-described characteristics now will be described in more detail. FIG. 2 is a plan view illustrating a unit pixel of the CMOS image device including a local impurity region according to the present invention. FIGS. 3 through 8 are sectional views illustrating a method of manufacturing the CMOS image device, cut along a line 3-3' of FIG. 2.

Figure 3:
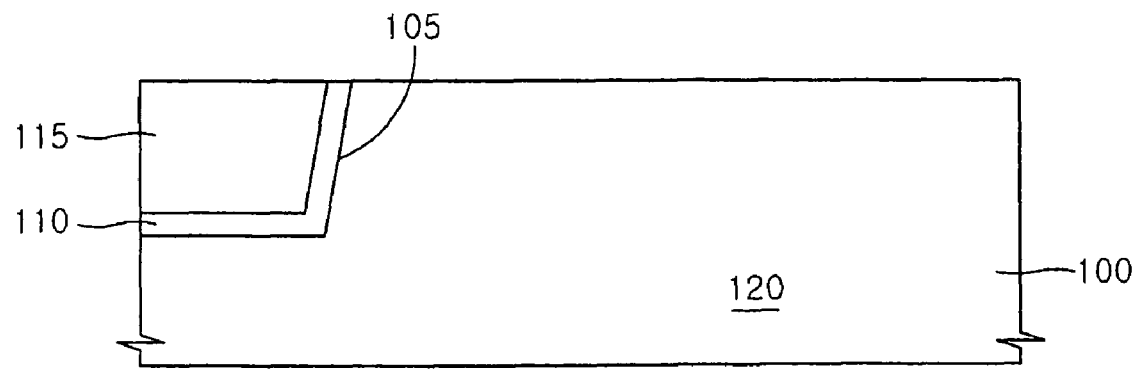
FIGS. 3 through 8 are sectional views illustrating a method of manufacturing the CMOS image device including the local impurity region according to the present invention, cut along a line 3-3' of FIG. 2.

Referring to FIGS. 2 and 3, a trench 105 is formed in a predetermined portion of a semiconductor substrate 100 of a first conductivity type (e.g., a p-type silicon substrate), using a well-known method. A semiconductor channel stop region 110 is selectively formed on side walls and a bottom surface of the trench 105. The channel stop region 110, which may be composed of a first conductivity type impurity (e.g., a p-type impurity), removes a dark current source that may be formed on an interfacial surface between layers of different materials (i.e., the silicon substrate 100 and an isolation layer). Also, the channel stop region 110 eliminates a parasitic signal path between adjacent active regions. The channel stop region 110 may be composed of boron (B) at a density of $10^{12}$-$10^{13}$ ions/cm$^2$. The trench 105 is filled with an insulating material to form an isolation layer 115. By forming the isolation layer 115, an active region 120 is defined. The active region 120 of a unit pixel includes a first active region 120a formed within a photodiode, and a second active region 120b formed within a transistor by extending from the first active region 120a.

Figure 4:
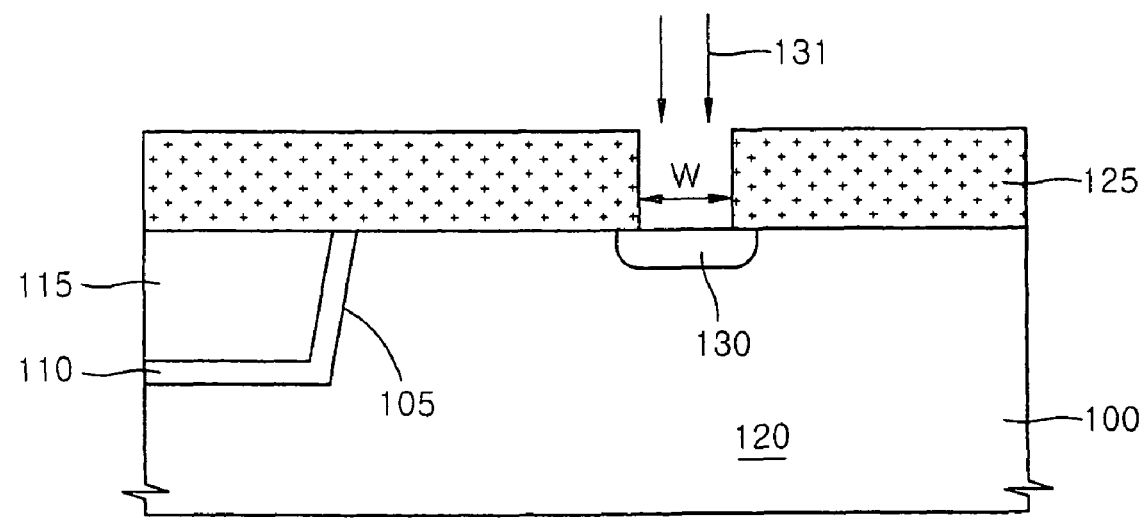

Referring to FIGS. 2 and 4, a first photoresist pattern 125 is formed on an upper surface of the semiconductor substrate 100 where the active region 120 is defined to expose a pre-transfer gate region (i.e., a pre-channel region of a transfer transistor). In this case, a width W of the region exposed by the first photoresist pattern 125 may be less than or equal to a linewidth of a subsequently formed transfer gate (or the channel length of the transfer transistor). A p-type impurity 131 (e.g., a boron impurity), is implanted into the exposed semiconductor substrate 100, thereby forming a p-type impurity region 130. The p-type impurity 131 is preferably implanted at an energy so that the p-type impurity region 130 can extend to a surface of the semiconductor substrate 100.

Figure 5:
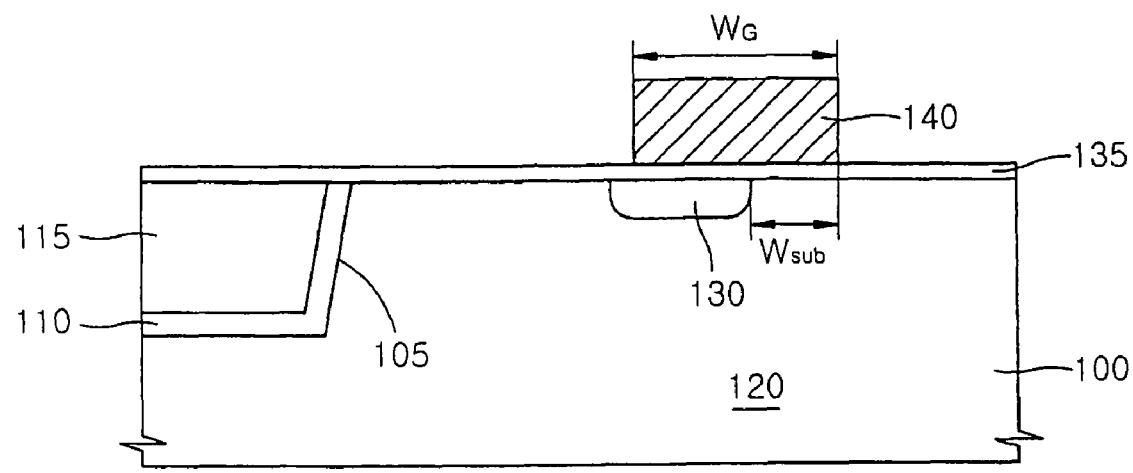

Referring to FIGS. 2 and 5, the first photoresist pattern 125 is then removed. Then, a gate oxide layer 135 and a conductive layer for a gate are deposited on an upper surface of the semiconductor substrate 100. A predetermined portion of the gate conductive layer is patterned to form a transfer gate 140, a reset gate 142, and a buffer gate 144. The transfer gate 140 may be formed on a border of the first active region 120a and the second active region 120b. The reset gate 142 and a buffer gate 144 may be respectively separated from the transfer gate 140 and formed on the second active region 120b. In FIG. 5, only the transfer gate 140 among the gates 140, 142 and 144 is illustrated.

As illustrated, the transfer gate 140 is partially overlapped with the p-type impurity region 130. That is, the p-type impurity region 130 is not disposed on the entire lower surface of the transfer gate 140, but is locally formed to partially overlap with the transfer gate 140. Accordingly, the transfer gate 140 simultaneously overlaps with the p-type impurity region 130 and the semiconductor substrate (active region) 100. In this case, a width (Wsub) of the semiconductor substrate 100 overlapped by the transfer gate 140 may be about 0.05-0.3 µm when a width ($W_G$) of the transfer gate 140 is 0.3-0.7 µm.

As further illustrated by FIG. 5, at least one perimeter portion of the p-type impurity region 130 may be formed on an outer periphery of the transfer gate 140. Preferably, the p-type impurity region 130 is shaped as a rectangle. Also, the borders of the three sides of the p-type impurity region 130 are placed outside corresponding sides of the transfer gate 140, and one border of the remaining one side extends underneath the transfer gate 140. Since the p-type impurity region 130 has the border partially disposed on the outer periphery of the transfer gate 140, a diffusion margin of a p-type impurity can be secured.

Figure 6:
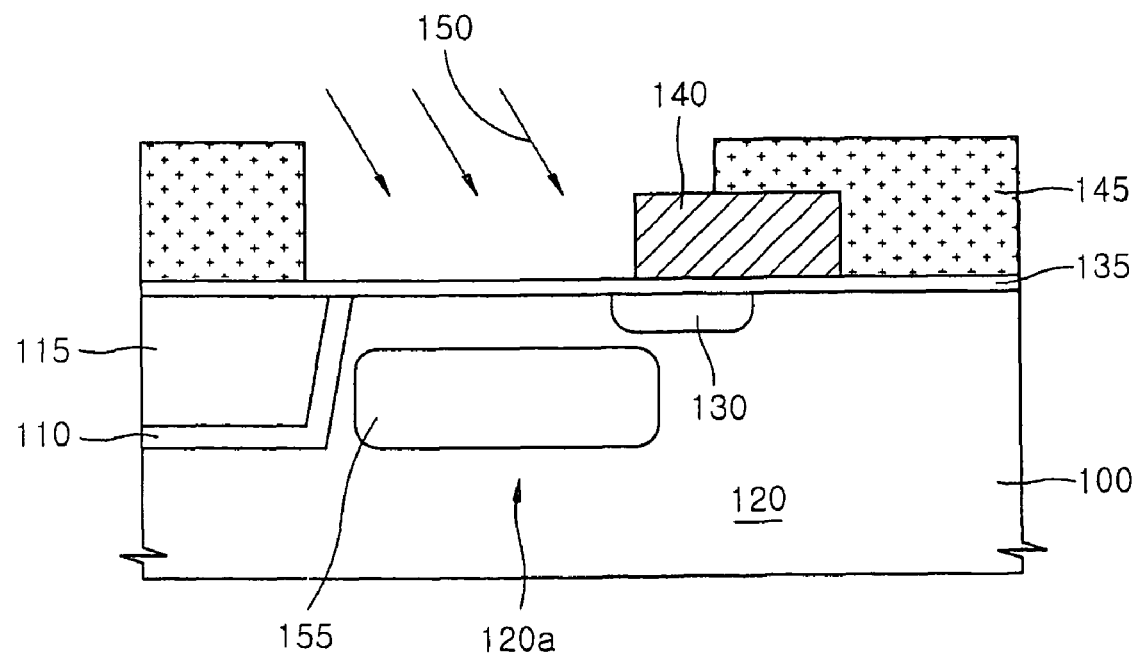

Referring to FIGS. 2 and 6, a second photoresist pattern 145 is formed on the semiconductor substrate 100 to expose the first active region 120a. An n-type impurity 150 is implanted into the exposed first active region 120a, thereby forming an n-photodiode region 155. In this case, the n-photodiode region 155 may extend partially underneath the transfer gate 140 to remove an image lag of the CMOS image device. Moreover, in order to form the n-photodiode region 155 that extends underneath the transfer gate 140, the n-type impurity may be implanted via tilt ion implantation to at a predetermined angle with respect to the surface of the semiconductor substrate 100.

Figure 7:
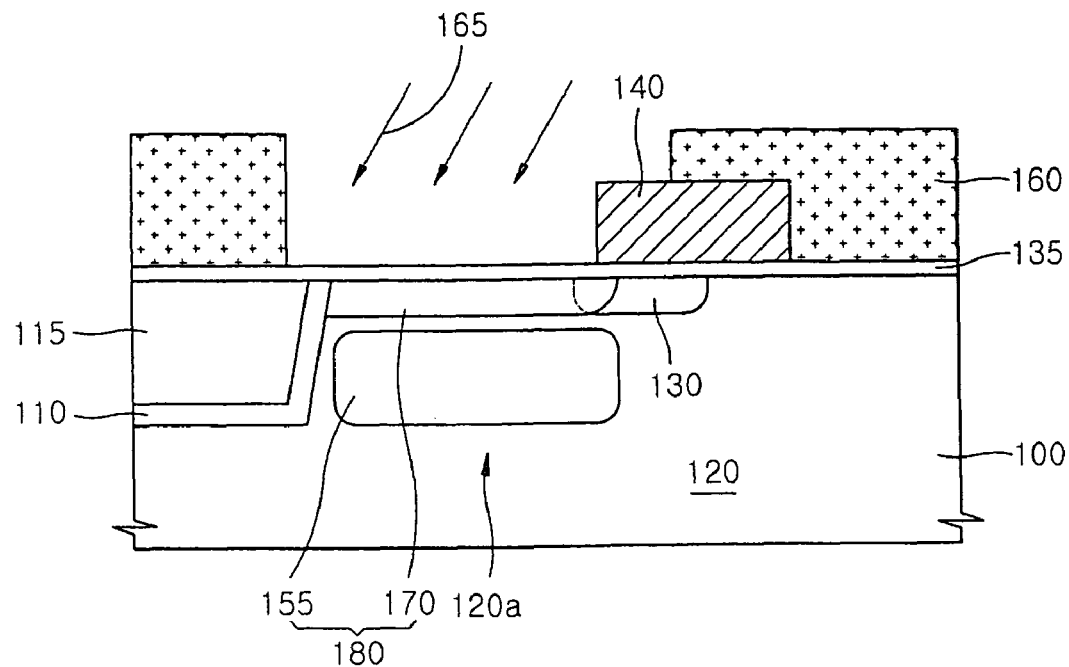

Referring to FIGS. 2 and 7, the second photoresist pattern 145 is removed. Then, a third photoresist pattern 160 is formed to expose the first active region 120a. The third photoresist pattern 160 is wider than the second photoresist pattern 145 by a predetermined width to inhibit p-type impurity region formation in an outer periphery of the isolation layer, which may result from collision of the impurity into the photoresist pattern 160 when the p-type impurity is subjected to the tilt ion implantation.

The p-type impurity 165 (e.g., boron ion) at a high density is implanted to the first active region 120a exposed by the third photoresist pattern 160, thereby forming a p-photodiode region 170 on an upper surface of the n-photodiode region 155. In this case, the p-type impurity 165 is subjected to tilt ion implantation at a predetermined angle with respect to the semiconductor substrate 100 to thereby be implanted into a region adjacent to the isolation layer 115. In this case, the p-type impurity 165 may be boron ion at a density of about $10^{13}$-$10^{14}$ ions/cm$^2$, implanted with an ion implantation energy lower than that of forming the n-type photodiode region 155. Here, a reference numeral 180 denotes the photodiode consisting of the n-photodiode region 155 and the p-photodiode region 170.

Figure 8:
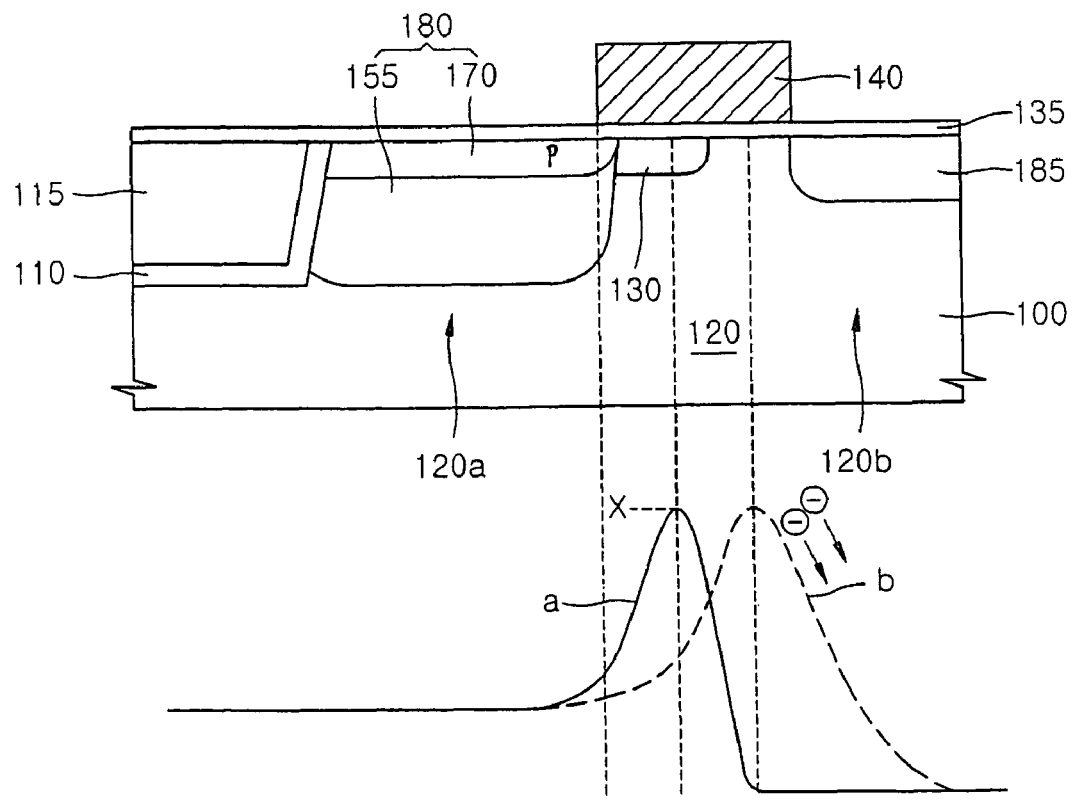

Referring to FIGS. 2 and 8, the third photoresist pattern 160 is removed and then an n-type impurity is implanted into the second active region 120b on one side or both sides of the gates 140, 142 and 144 to form a floating diffusion region 185 and source and drain regions 187. Thereafter, respective impurity regions are activated to complete the unit pixel of the CMOS image device. Since the p-type impurity region 130 disposed on the lower surface of the transfer gate 140 is partially overlapped with the transfer gate 140, a peak of a potential barrier a of the transfer gate 140 is placed adjacent to the photodiode 180. By doing so, the electrons generated in the channel region of the transfer transistor are not introduced toward the photodiode 180, but flow toward the floating diffusion region 185, thereby decreasing dark current components. A dotted line b on the lower portion of FIG. 8 denotes the conventional potential barrier.

Figure 9:
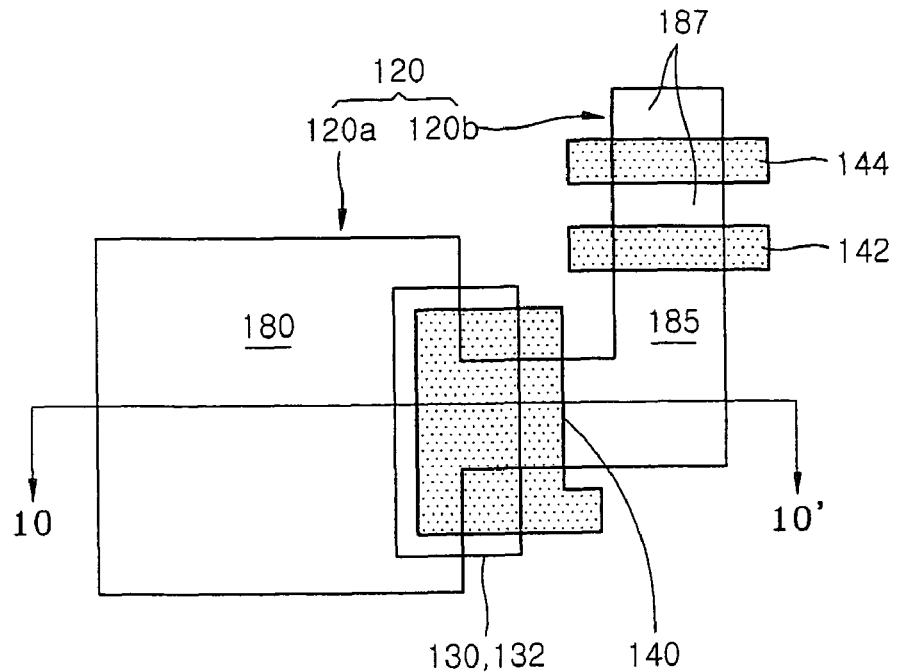
FIG. 9 is a plan view of the unit pixel of the CMOS image device according to another embodiment of the present invention.
Figure 10:
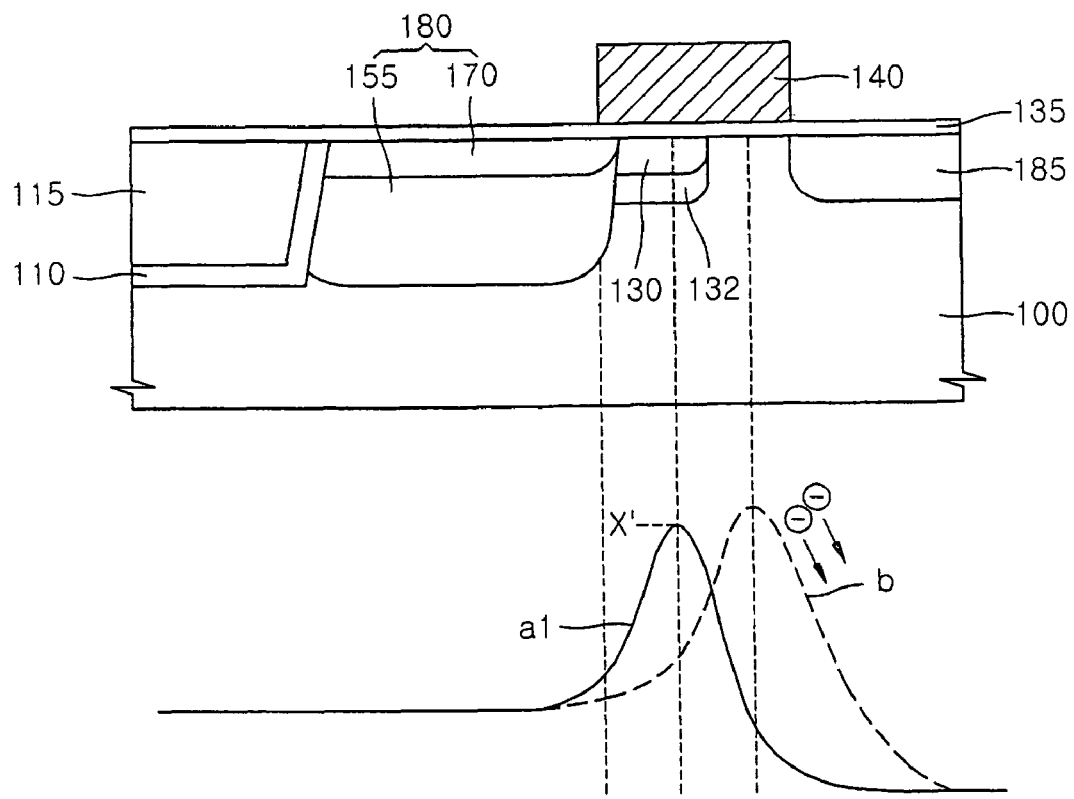
FIG. 10 is a sectional view, cut along a line 10-10' of FIG. 9.

In a CMOS image device, optical electrons are captured by the photodiode 180 when picking up light with a strong intensity. If a large quantity of optical electrons is captured, a blooming phenomenon caused when optical electrons flow toward the neighboring photodiode 180 may occur. In order to prevent the blooming phenomenon, the potential barrier of the transfer gate 140 is lowered to discharge the electrons generated in the photodiode 180 to the floating diffusion region 185. In order to prevent the blooming phenomenon in an embodiment of FIGS. 9-10, the n-type impurity region 132 is formed on a lower surface (a channel region of the transfer transistor) of the transfer gate 140. The n-type impurity region 132 acts to lower the potential barrier of the transfer gate 140 to allow the large quantity of optical electrons captured within the photodiode 180 to easily flow toward the floating diffusion region 185. Simultaneously, electrons remaining in the channel region of the transfer transistor are discharged toward the floating diffusion region 185. In the lower portion of FIG. 10, a reference character a1 denotes the potential barrier of the transfer gate 140 when the n-type impurity region 132 is formed on the lower surface of the p-type impurity region 130, a reference character b denotes the potential barrier of the conventional transfer gate 140, and a reference character X' denotes a peak of the potential barrier a2.

When the n-type impurity region 132 is formed on a lower surface of the p-type impurity region 130, it may be formed subsequent to forming the p-type impurity region 130. That is, as shown in FIG. 4, the n-type impurity region 132 may be formed between the steps of forming the p-type impurity region 130 and removing the first photoresist pattern 125. In this case, the n-type impurity region 132 is partially overlapped with the transfer gate 140 similar to the p-type impurity region 130.

Figure 11:
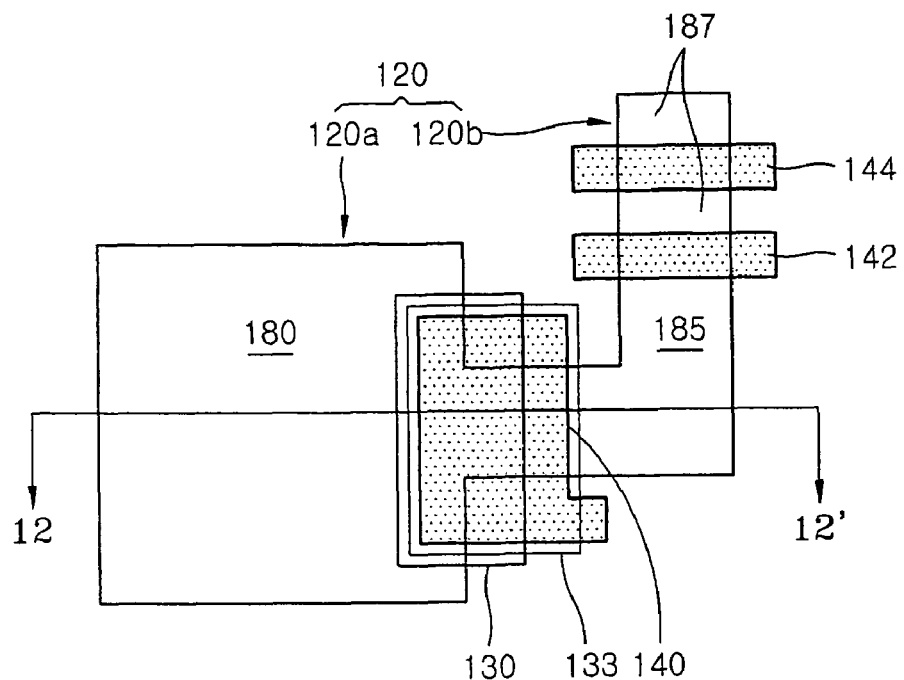
FIG. 11 is a plan view of the unit pixel of the CMOS image device according to still another embodiment of the present invention.
Figure 12:
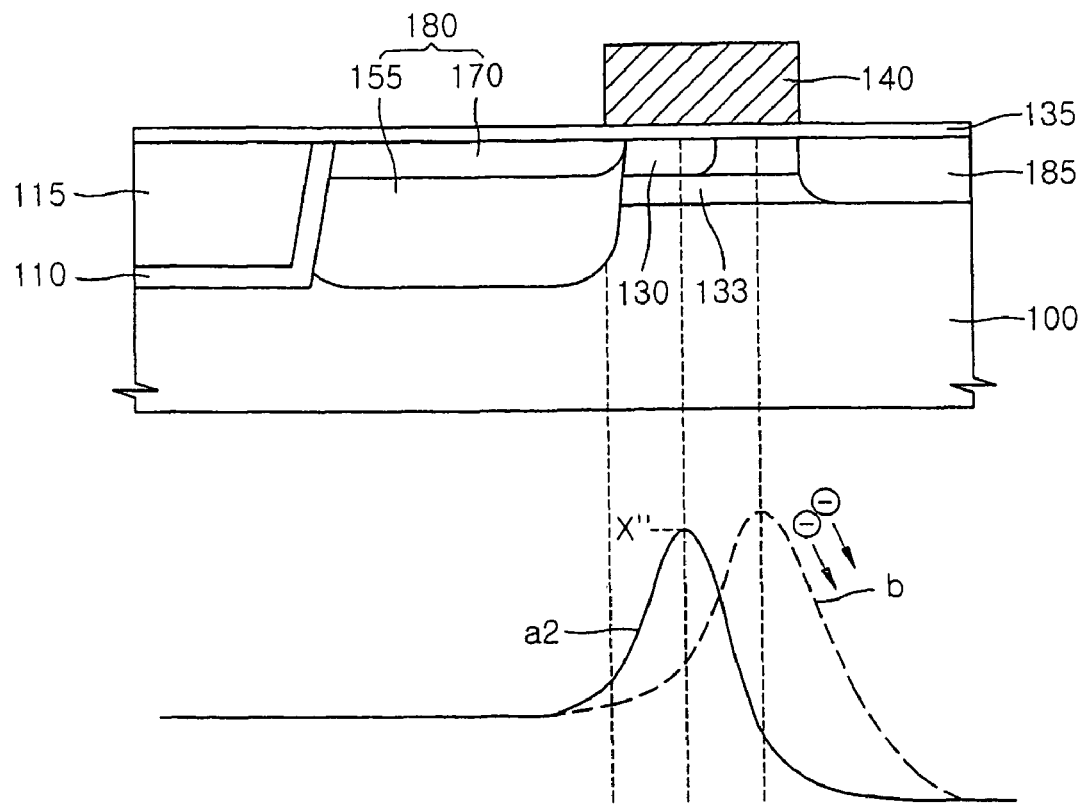
FIG. 12 is sectional view, cut along a line 12-12' of FIG. 11.

Referring to FIGS. 11 and 12, the n-type impurity region 133 may be wholly overlapped with the transfer gate 140. The n-type impurity region 133 may be obtained by removing first photoresist pattern 125 (refer to FIG. 4), additionally forming a photoresist pattern (not shown) having an aperture with the transfer gate size, and then implanting the n-type impurity in the exposed region. Thereafter, the additionally formed photoresist pattern (not shown) is removed. When the n-type impurity region 133 is wholly overlapped with the transfer gate 140, and is partially overlapped with the p-type impurity region 130, a potential barrier a2 of the transfer gate 140 has an abrupt slope between the channel region and the floating diffusion region 185 as shown in the lower portion of FIG. 12. Therefore, the electrons remaining in the channel region flow out of the floating diffusion region 185. By doing so, the dark current elements can be more easily eliminated. Here, a reference character X" denotes a peak of the potential barrier a2.

Figure 13:
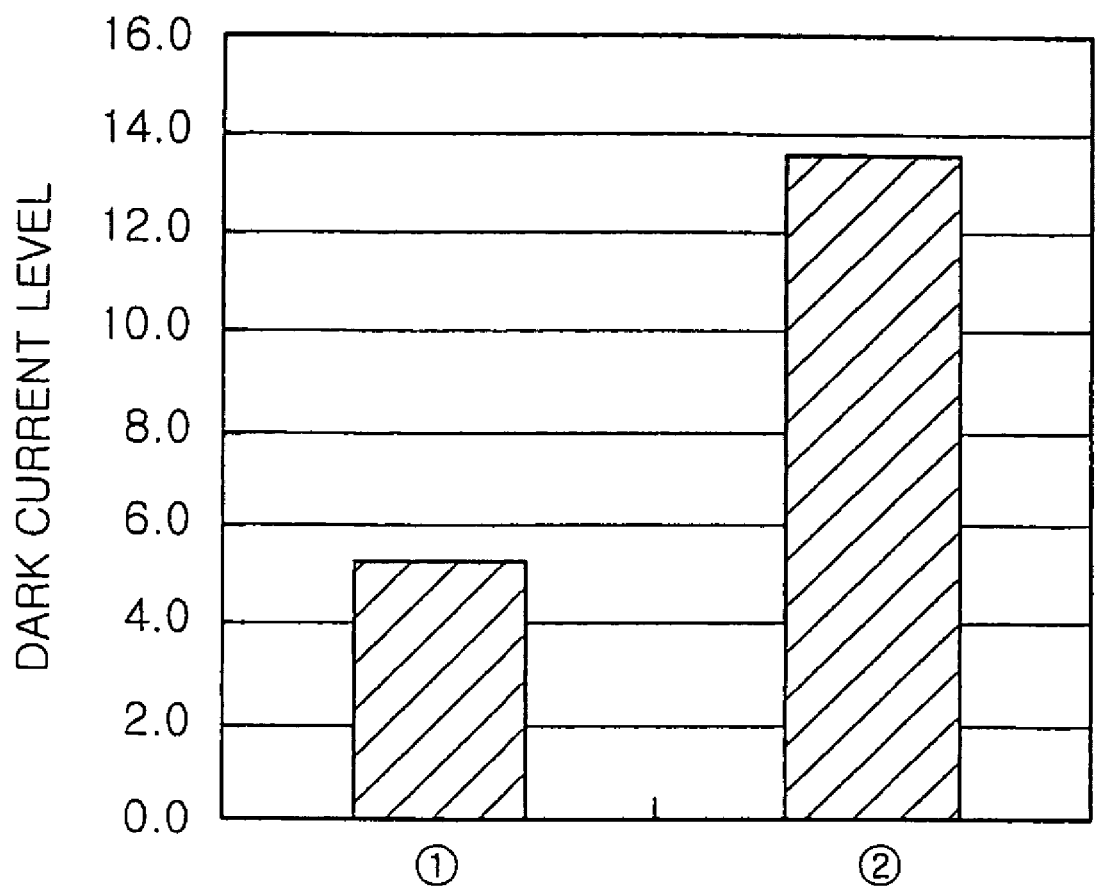
FIG. 13 is graphs plotting the dark current when the p-type impurity region and the transfer gate are partially overlapped and wholly overlapped, respectively.

FIG. 13 is histogram plotting the dark current level (y-axis) when the p-type impurity region and the transfer gate are partially overlapped ① and wholly overlapped ②, respectively. Referring to FIG. 13, the region ① is of a CMOS image device designed by making a width of the transfer gate 140 to be 0.5 μm and a border of the p-type impurity region 130 inwardly disposed from one edge of the transfer gate 140 as many as 0.1 μm. The region ② is of a CMOS image device designed by making a line width of the transfer gate 140 to be 0.5 μm and the p-type impurity region 130 wholly overlaps with one edge of the transfer gate 140. When two CMOS image devices are compared, the dark current level is about 5.0 in case of the region ①, and is about 13.0 in case of the region ②. As a result, when the p-type impurity region is partially overlapped the transfer gate, the dark current is significantly lowered.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A CMOS image device comprising:
a semiconductor substrate of first conductivity type having an isolation layer;
a transfer gate formed on the semiconductor substrate, and electrically insulated from the semiconductor substrate;
a photodiode formed in the semiconductor substrate on one side of the transfer gate;
a floating diffusion region formed in the semiconductor substrate on the other side of the transfer gate;
a first impurity region of first conductivity type disposed in the substrate between the photodiode and the floating diffusion region; and
a second impurity region of second conductivity type disposed under the first impurity region,
wherein the first impurity region is connected to the photodiode and being partially overlapped with a portion of the transfer gate.

2. The CMOS image device of claim 1, wherein the first impurity region is spaced from the floating diffusion region by a predetermined distance.

3. The CMOS image device of claim 1, wherein the second impurity region is spaced from the floating diffusion region by a predetermined distance.

4. The CMOS image device of claim 1, wherein the first impurity region is a p-type impurity region.

5. The CMOS image device of claim 1, wherein the second impurity region is an n-type impurity region.

6. The CMOS image device of claim 1, wherein the second impurity region being connected to the floating diffusion region.

7. The CMOS image device of claim 1, wherein the photodiode comprises an n-type photodiode region and a p-type photodiode region formed on an upper surface of the n-type photodiode region.

8. The CMOS image device of claim 1, wherein the isolation layer is a trench type, and a channel stop impurity region is formed on a sidewall and a bottom surface of the trench.

9. The CMOS image device of claim 8, wherein the channel stop impurity region is a p-type impurity region.

10. A CMOS image device comprising:
   a semiconductor substrate of first conductivity type having an isolation layer;
   a transfer gate formed on the semiconductor substrate, and electrically insulated from the semiconductor substrate;
   a photodiode formed in the semiconductor substrate on one side of the transfer gate, said photodiode comprising a second diode region of second conductivity type and a first diode region of first conductivity type extending between the second diode region and a surface of said semiconductor substrate upon which said transfer gate extends;
   a floating diffusion region formed in the semiconductor substrate on the other side of the transfer gate;
   a first impurity region of first conductivity type disposed in the substrate between the photodiode and the floating diffusion region, said first impurity region having a higher first conductivity type doping concentration therein relative to said semiconductor substrate; and
   a second impurity region of second conductivity type disposed under the first impurity region;
   wherein said second impurity region extends to a shallower depth in said semiconductor substrate relative to the second diode region; and
   wherein the first impurity region is connected to the photodiode and being overlapped with a portion of the transfer gate.

* * * * *